United States Patent
Laville et al.

(10) Patent No.: US 6,653,669 B2
(45) Date of Patent: Nov. 25, 2003

(54) DEVICE FOR THE ADJUSTMENT OF CIRCUITS AFTER PACKAGING

(75) Inventors: Sébastien Laville, Grenoble (FR); Serge Pontarollo, St. Martin le Vinoux (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/121,427

(22) Filed: Apr. 12, 2002

(65) Prior Publication Data

US 2003/0022455 A1 Jan. 30, 2003

Related U.S. Application Data

(63) Continuation-in-part of application No. 09/604,989, filed on Jun. 28, 2000, now Pat. No. 6,410,398.

(30) Foreign Application Priority Data

Jun. 28, 1999 (FR) .............................................. 99 08240

(51) Int. Cl.[7] ...................... H01L 31/072; H01L 31/109; H01L 31/0328; H01L 31/0336
(52) U.S. Cl. ......................... 257/197; 257/487; 257/565
(58) Field of Search ................................. 257/197, 273, 257/288, 328, 392, 401, 481, 484, 487, 565, 603

(56) References Cited

U.S. PATENT DOCUMENTS

| | | | | |
|---|---|---|---|---|
| 5,065,132 A | | 11/1991 | Taddiken et al. ............. 338/334 |
| 5,539,327 A | * | 7/1996 | Shigehara et al. ............. 326/30 |
| 5,621,601 A | * | 4/1997 | Fujihira et al. ................. 361/93 |
| 5,920,182 A | * | 7/1999 | Migliavacca ................. 323/282 |
| 6,169,309 B1 | * | 1/2001 | Teggatz et al. ............. 257/328 |
| 6,410,398 B1 | * | 6/2002 | Forel et al. ................. 438/382 |

OTHER PUBLICATIONS

Patent Abstracts of Japan, vol. 4, No. 78, Jun. 6, 1980 & JP55042348A, Sharp Corp., Mar. 25, 1980.

* cited by examiner

Primary Examiner—David Nhu
(74) Attorney, Agent, or Firm—Allen, Dyer, Doppelt Milbrath & Gilchrist, P.A.; Lisa K. Jorgenson

(57) ABSTRACT

An integrated circuit includes an adjustment resistor, and at least one control transistor connected to a first voltage reference. An adjustment element is connected in parallel with the adjustment resistor for adjusting a combined electrical resistance of the adjustment element and the resistor. The adjustment element is connected to the control transistor, and includes a substrate, and a MOS transistor having a source, a drain, and a gate on the substrate. The MOS transistor defines a parasitic bipolar transistor with the substrate. The adjustment element further includes a first resistor connected between the substrate and the source, and a second resistor is connected between the substrate and the drain. A diode is connected in series with the second resistor between the substrate and the drain. The gate and the source of the MOS transistor are connected together with the MOS transistor being broken down so that the adjustable element forms an electrical resistance.

28 Claims, 6 Drawing Sheets

DEVICE FOR THE ADJUSTMENT OF CIRCUITS AFTER PACKAGING

RELATED APPLICATION

The present application is a continuation-in part of U.S. patent application Ser. No. 09/604,989 filed on Jun. 28, 2000 U.S. Pat. No. 6,410,398 the disclosure of which is being incorporated herein by reference.

FIELD OF THE INVENTION

The present invention relates to the field of analog and digital integrated circuits.

BACKGROUND OF THE INVENTION

It is desirable that analog and digital integrated circuits use as small an area of silicon as possible to reduce costs while maintaining high precision. The precision of eliminating circuits containing defects is excellent when the silicon wafers are sorted. However, this precision may deteriorate during the subsequent encapsulation step.

By way of example, offset voltages in an operational amplifier are on the order of 2 mV during wafer sorting which, after adjustment, are brought back down to 1 mV. However, packaging or encapsulation creates an additional shift bringing the final offset voltage back to 1.5 mV.

For a voltage reference or voltage regulator, the precision during wafer sorting is 0.8%, which is reduced to 0.2% after adjustment. As in the case of an amplifier, packaging introduces a shift bringing the final precision to 0.5%.

SUMMARY OF THE INVENTION

An object of the present invention is to adjust integrated circuits after they have been packaged, especially standard low-cost integrated circuits produced in high volume. A very high precision is to be obtained, which is at least equal to that obtained after adjustment during wafer sorting.

According to one aspect of the invention, the integrated electronic circuit comprises a resistor to be adjusted, an adjustment element mounted in parallel with the resistor to be adjusted, and at least one control transistor mounted between the adjustment element and a ground contact. The adjustment element comprises a MOS transistor, a first resistor placed between the substrate and the source of the MOS transistor, and a second resistor and a diode which are placed in series between the substrate and the drain. Both the gate and the source are short-circuited so that application of a voltage between the drain and the source biases the base/emitter junction of the parasitic bipolar transistor of the MOS transistor.

A breakdown of the MOS transistor is caused by an avalanche of the drain/substrate junction, an irreversible breakdown of the drain/substrate junction and a short circuit between the drain and the source. The element forms a resistor whose value is determined by the current due to the voltage.

A resistor may thus be adjusted independently of ground. In one embodiment of the invention, the circuit comprises a resistor in series with the resistor to be adjusted. The resistor includes a common terminal with the adjustment element. In one embodiment of the invention, the resistor to be adjusted is mounted with one terminal at a floating potential and another terminal is connected to the supply contact. In one embodiment of the invention, the control transistor is an NMOS transistor.

In one advantageous embodiment of the invention, the circuit comprises a first control transistor mounted between a supply contact and the adjustment element. A second control transistor is mounted between the adjustment element and a ground contact.

A resistor may thus be adjusted independently of ground and of the supply. In one embodiment of the invention, the resistor to be adjusted is mounted with two terminals at a floating potential. In one embodiment of the invention, the resistor to be adjusted is mounted with one terminal at a floating potential and another terminal is connected to the supply contact or to the ground contact. In one embodiment of the invention, the first control transistor is a PMOS transistor.

The second control transistor may be an NMOS transistor. The MOS transistor of the adjustment element may also be an NMOS transistor. However, a PMOS transistor may be used. Advantageously, the MOS transistor of the adjustment element includes an isolated structure. In one embodiment of the invention, the MOS transistor of the adjustment element is surrounded by a ring of p+-type conductivity. The ring may be surrounded by a well having a distance of greater than or equal to 20 $\mu$m.

In one mode of implementation of the invention, the application of a voltage between the drain and the source takes place before the circuit is encapsulated. In a preferred mode of implementation of the invention, the application of a voltage between the drain and the source takes place after encapsulating the circuit. The breakdown of the MOS transistor may be induced via the existing pins of the integrated circuit: ground, supply, input(s) and output(s). The voltage may be less than 10 volts, and is preferably less than 9 volts. The breakdown current may be less than 2 mA.

The base of the parasitic bipolar transistor is formed by the substrate, the collector is formed by the drain of the MOS transistor, and the emitter is formed by the source of the MOS transistor. The diode may be connected in such a way that it allows a current to flow from the drain to the substrate.

The present invention also provides a device for inducing the breakdown of a circuit as described above. The device comprises an analog/digital converter for the voltage applied to each input of the device, and generating means for generating a voltage for controlling a switch. The generating means is connected to the output of the converter, and a switch which is controlled by the generating means has one terminal connected to a supply and another terminal to be connected to the circuit.

Advantageously, the device comprises a reversible turn-off means capable of acting on the generating means. Advantageously, the device comprises an irreversible turn-off means capable of acting on the generating means. The turn-off means comprises a circuit that is able to breakdown. This turn-off means may be capable of turning off all the switches.

The circuit may comprise a diode such as a Zener diode, for example, or a transistor such as a MOS transistor, for example. The circuit may comprise a first resistor between the substrate and the source of a MOS transistor, and a second resistor and a diode in series between the substrate and the drain. The gate and the source are short-circuited so that application of a voltage between the drain and the source causes the base/emitter junction of the parasitic bipolar transistor of the MOS transistor to be biased. The MOS transistor breaks down by an avalanche of the drain/substrate junction, an irreversible breakdown of the drain/substrate junction and a short circuit between the drain and the source. The component forms a resistor having a value determined by the current due to the voltage.

The invention therefore makes it possible to provide standard integrated circuits with enhanced precision. The use of a so-called "snap-back" MOS transistor makes it possible to obtain a short circuit, and therefore to obtain a resistor within an integrated circuit after it has been encapsulated by acting on the existing pins of the integrated circuit. The component thus produced occupies only a small area on a silicon wafer since it comprises only one MOS transistor.

The fact that the gate and the source of the MOS transistor are short-circuited insures that it is permanently turned off, and prevents it from having any influence on the operation of the adjacent electronic circuits. Before breakdown, the component is like a turned-off MOS transistor. The diode makes it possible to avoid a leakage current during steady-state operation in those parts of the circuit to be adjusted, which in general, are operating at a voltage of a few millivolts. More generally, these parts of the circuit operate at a voltage below the threshold voltage of the diode.

The invention draws benefit from a natural characteristic of MOS transistors, which is to have parasitic components, particularly a bipolar transistor. In some configurations, these parasitic components are harmful. During electrostatic discharges circuits may be seriously damaged by the parasitic transistor being turned on.

On the other hand, the invention uses the parasitic bipolar transistor of the MOS transistor to make a short circuit to obtain a resistor having a predetermined value between the drain and the source of the MOS transistor. That is, between the collector and the emitter of the parasitic bipolar transistor. This component may be regarded as an anti-fuse. This is because a fuse is a closed circuit in the normal state and an open circuit after breakdown. Here, the component is an open circuit before breakdown (i.e., a turned-off MOS), and a closed circuit after breakdown with a low residual resistance value.

BRIEF DESCRIPTION OF THE DRAWINGS

The present invention will be more clearly understood on studying the detailed description of a few embodiments taken as non-limiting examples and illustrated by the appended drawings, in which.

DETAILED DESCRIPTION OF THE PREFERRED EMBODIMENTS

Figure 1:
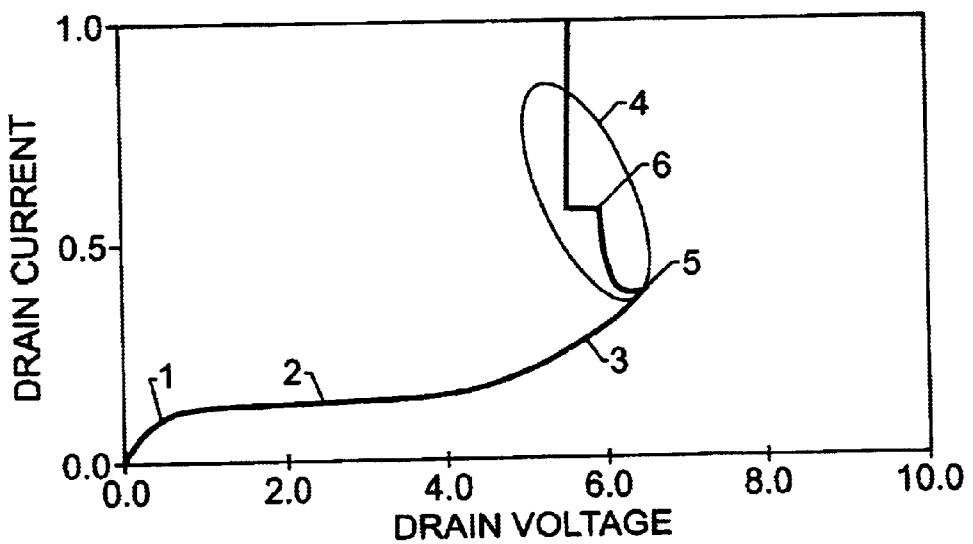
FIG. 1 is a characteristic curve on the operation of an NMOS transistor in accordance with the present invention.

As may be seen in FIG. 1, in which the drain voltage is plotted on the x-axis and the drain current is plotted on the y-axis, an NMOS transistor has four operating regions. Region 1 is a conventional linear operation of a MOS transistor. Region 2 is operation in a saturated mode, in which the current changes only very slightly with voltage. Region 3 is called the avalanche region that includes a weakening of the drain/substrate junction caused by an avalanche breakdown of the junction. Region 4 is conduction of the parasitic bipolar transistor with a first breakdown labeled 5 on the curve which is reversible, and a second breakdown labeled 6 on the curve which is destructive, and therefore irreversible.

Beyond the second breakdown 6, the current increases extremely rapidly with voltage. The slope of the curve is almost vertical. This breakdown process, also called a second breakdown, is irreversible. Beyond the breakdown 5, called snap-back, the curve shows a decrease in the resistance of the MOS transistor. For an approximately constant drain voltage, the current increases. The choice of the breakdown current makes it possible to determine, to a certain extent, the value of the resistor of the MOS transistor after breakdown 6. This is under normal operating conditions.

Figure 2:
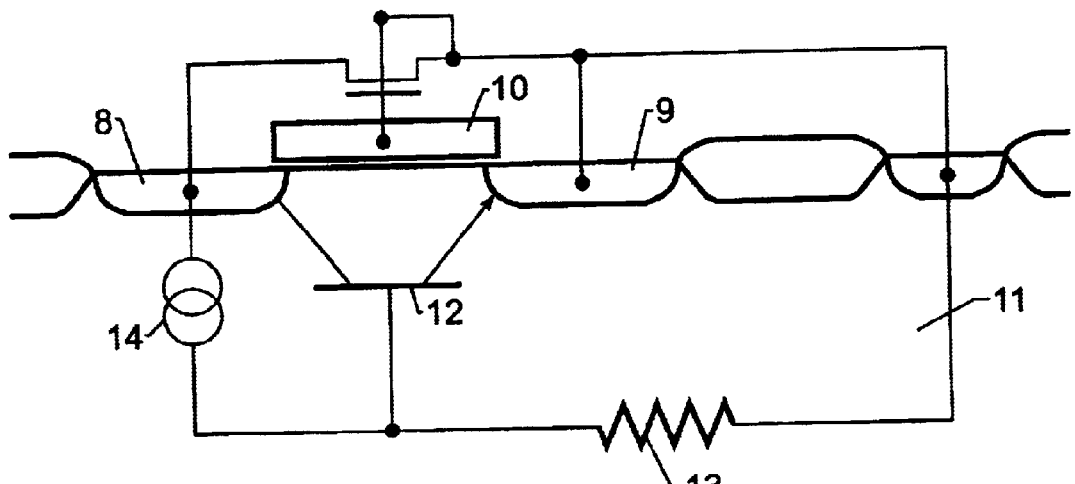
FIG. 2 is a cross-sectional view of a MOS transistor in accordance with the present invention.

FIG. 2 shows the structure of the various parts of the MOS transistor. The MOS transistor comprises a drain 8, a source 9 and a gate 10 which are formed on a substrate 11. Present in the substrate 11 is a parasitic bipolar transistor 12 whose collector is formed by the drain 8, whose emitter is formed by the source 9 and whose base is formed by the substrate 11. The distance separating the active base (between the drain and the source) and the base contact is modeled by a substrate resistor 13. A current source 14 between the resistor 13 and drain is used to model the natural characteristics of the MOS transistor.

Figure 3:
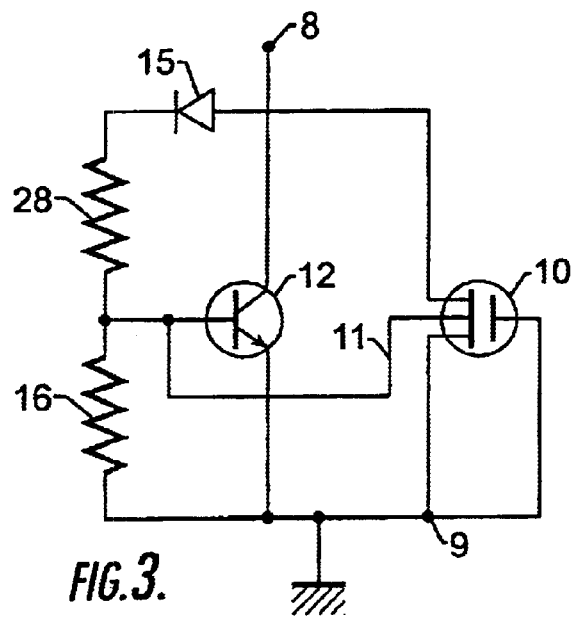
FIG. 3 is a diagram of a component according to the present invention with a MOS transistor and its parasitic bipolar transistor.

In the diagram according to the present invention illustrated in FIG. 3, the substrate 11 is connected to the drain 8 via a resistor 28 and a diode 15. The diode 15 allows a current to flow from the drain 8 to the substrate 11, but prevents it from flowing in the opposite direction. A resistor 16 is between the base of the parasitic bipolar transistor 12 and the source 9. The source is connected to the emitter of the parasitic bipolar transistor 12. The resistor 16 makes it possible to achieve a good equipotential for the base/emitter junction of the parasitic bipolar transistor.

In the steady state and in the absence of a breakdown, the circuit portion in parallel with the adjustment device is subjected to a voltage. The voltage may be, for example, on the order of 100 mV. This is below the threshold voltage of the diode 15, which prevents the appearance of a leakage current from the drain to ground. The resistor 16 makes it possible to draw off some of the possible leakage current from the diode 15 so that the base current of the parasitic bipolar transistor is as low as possible.

The drain 8 is connected to a first supply voltage, while the source 9 and the gate 10 are short-circuited and connected to ground. By applying a high voltage between the collector and the emitter, this voltage is divided between the two junctions. The emitter-base junction is slightly forward-biased, and electrons are injected into the base, and after passing through the base add to the leakage current of the base-collector junction. Thus, by biasing the substrate, the base-emitter junction is turned on without there having been a total avalanche of the collector-base junction. The breakdown phenomenon then occurs. By adding current to the leakage current of the base-collector junction makes it possible to reduce both the breakdown voltage and the breakdown current of the component.

The component reverts to a second, irreversible breakdown mode which results in a heat-up and destruction of the crystal lattice. Next, a polysilicon resistor is created between the drain and the source. To initiate the avalanche phenomenon, a large enough voltage must be imposed on the drain. This voltage depends on the doping characteristics and on the gain of the parasitic bipolar transistor, and is proportional to the square of the electric field.

By way of example, tests have been carried out in HF4 CMOS technology with an NMOS transistor whose channel has the following dimensions: width=1 $\mu$m, and length=0.7 $\mu$m. The source is grounded and a voltage ramp rising up to 9.5 volts is applied to the drain with current limitation. For a 2 mA collector current, a post-breakdown resistance of 11 ohms is obtained with a base current in the region of 100 $\mu$A, and in all cases between 60 and 160 $\mu$A.

It is suitable to use a voltage ramp with a steep slope, which makes it possible to reduce the duration of the breakdown process and to insure a satisfactory breakdown. Within a certain range, the value of the resistor is independent of the collector current. Thus, it is possible to create the breakdown with a voltage of less than 10 volts, which does not carry the risk of damaging the integrated circuit in HF4CMOS technology, or in other technologies that withstand only low voltages.

Of course, what has been described with an NMOS transistor also applies to the case of the PMOS transistor. More generally, the invention makes it possible to obtain a breakdown voltage compatible with the voltage limit of the integrated circuit, with the voltage limit being based upon the technology of the integrated circuit.

It is particularly advantageous to use a transistor whose channel is as short as possible. The shorter the channel the lower the breakdown voltage. This is on account of the increase in the drain current and the increase in the number of electron-hole pairs generated for a constant channel width. Decreasing the channel width results in a decrease in the voltage and of the current of the second breakdown 6 illustrated in FIG. 1. Even if the width of the channel does not fall within the voltage of the first breakdown 5, a reduced width will increase the thermal effect of the second breakdown 6 since the field lines are then more unidirectional. This implies a reduction in the coupling of the second breakdown. It is therefore particularly advantageous to use MOS transistors having small dimensions.

The creation of the resistor by the breakdown of the MOS transistor in an integrated circuit after encapsulation has to take place via the conventional pins used for the inputs and outputs, and the supply and ground terminals without providing additional pins. Providing additional pins would be expensive, and subsequently, redundant. It is therefore possible to apply a constant positive voltage on the supply, and to apply a negative voltage ramp to ground with a current limitation to create the desired resistor. Such a resistor may be placed, for example, in the "feet" of a differential amplifier which, in general, forms the input stage of an operational amplifier. The term "foot" should be understood as meaning the active-load emitter terminal of the differential amplifier.

The invention thus makes it possible to take advantage of a natural characteristic of MOS transistors that is normally regarded as a drawback. This is done to create an integrated resistor to obtain integrated circuits produced in very high volume with a high precision.

Figure 4:
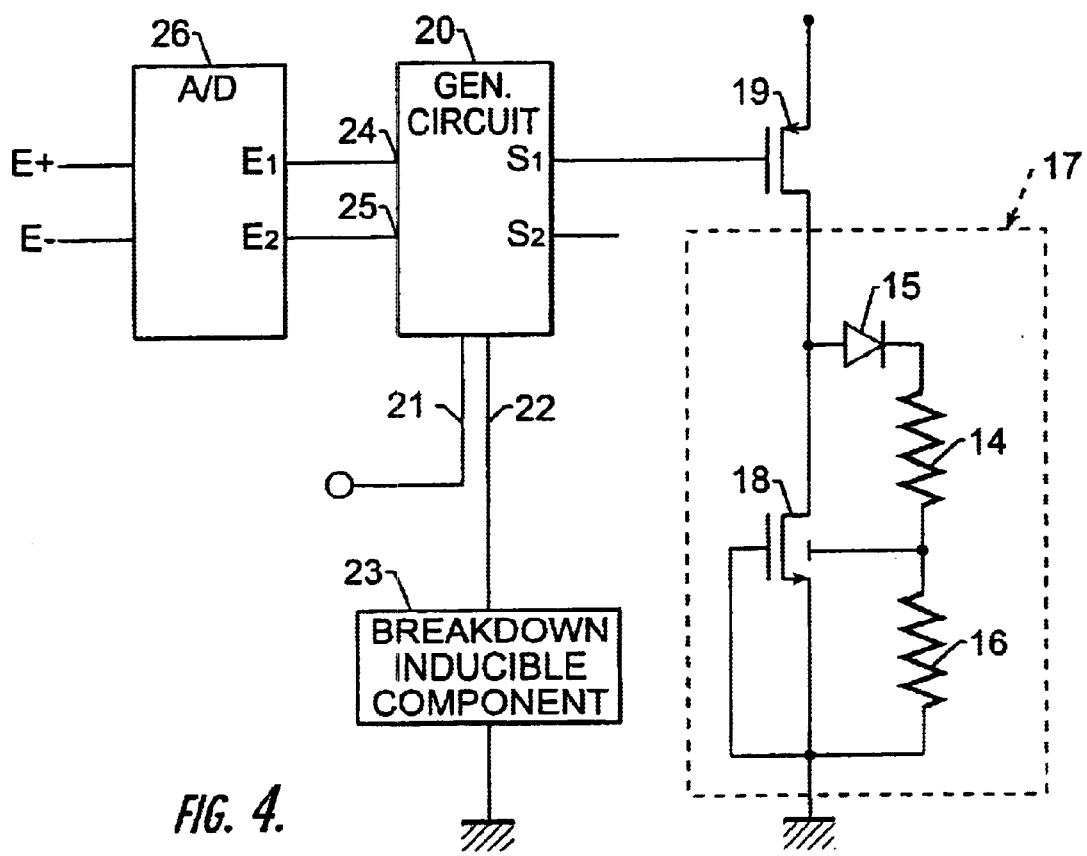
FIG. 4 is a diagram showing the component according to the present invention provided with a breakdown inducible component.

The breakdown of the MOS transistor in an integrated circuit after encapsulation requires suitable induction, as well as means for inhibiting the breakdown before encapsulation during wafer sorting. For this purpose, a structure as illustrated in FIG. 4 may be provided. The breakdown inducible component 17 comprises an NMOS transistor 18, a diode 15 and two resistors 14 and 16. These elements are placed, as explained above, for a breakdown with prebiasing of the base-emitter junction of the parasitic bipolar transistor. Using the induction device, it is also conceivable to induce breakdown in a MOS transistor whose substrate is connected to ground. This requires a higher breakdown voltage of about 16 volts, or else a Zener diode of even higher breakdown voltage of about 24 volts, for example.

The breakdown inducible component 17 (or the MOS transistor or the Zener diode) is connected to ground and to the drain of a PMOS transistor 19. The source of the PMOS transistor 19 is connected to a supply terminal, and its gate is connected to a generator circuit or generating means 20 for generating a control voltage. Other types of switches may be used instead of the transistor 19. The generating means 20 comprises a plurality of outputs $S_1, S_2, \ldots S_n$, each connected to the control input of a switch capable of inducing the breakdown of a breakdown inducible component 17. For the sake of clarity, only a single component 17 whose breakdown is induced via the output $S_1$ has been shown in FIG. 4.

The generating means 20 is connected to a terminal 21 accessible during wafer sorting before encapsulation. This makes it possible to inhibit the generating means 20 by applying a predetermined voltage to temporarily prevent breakdown of a breakdown inducible component 17, which is connected to one of the outputs $S_1, S_2, \ldots S_n$.

The generating means 20 comprises an input 22 connected to a breakdown inducible component 23 which may be of the same type as the breakdown inducible component 17, or a MOS transistor or a Zener diode. The breakdown inducible component 23 is also connected to ground. The breakdown of the component 23 brings the voltage on the input 22 to that on the ground terminal. This prevents breakdown of the breakdown inducible component 17 connected to one of the outputs $S_1, S_2, \ldots S_n$. This operation is carried out after the adjustment, which is carried out after encapsulation. This prevents any subsequent loss of adjustment by breakdown of one of the breakdown inducible components 17 connected to one of the outputs $S_1, S_2 \ldots S_n$, especially by the user of the integrated circuit.

Preferably, the reversible inhibition terminal 21 is formed on the irreversible inhibition input 22, thereby making it possible to save space. During the wafer sorting, a given voltage is applied to the terminal 21. This given voltage is capable of temporarily preventing the breakdown of a breakdown inducible component 17. In addition, this temporarily prevents the breakdown of the breakdown inducible component 23 since the PMOS transistor 19 forming a switch of the component 23 is turned off.

After encapsulation, the terminal 21 is no longer accessible and only a particular combination of voltages applied to the pins of the package containing the structure of FIG. 4 may cause the breakdown of the breakdown inducible component 23. The breakdown of the component 23 causes all the outputs $S_1, S_2, \ldots S_n$ to go to a high level, hence turning off the MOS transistor 19 with almost zero consumption. This prevents the breakdown of component 17.

The generating means 20 is connected via two inputs 24, 25 to two outputs E1 and E2 of an analog-digital converter 26. The analog-digital converter 26 has two inputs E+, E− which are connected, for example, to the inputs of an operational amplifier to be balanced after encapsulation.

The two inputs E+, E− each receive an analog voltage between 0 and 10 volts, for example. The outputs $S_1$, $S_2$, . . . $S_n$ have binary output levels, one cap-able of turning off the transistor 19 and the other of turning it on, and hence inducing breakdown of the breakdown inducible component 17 connected to the corresponding output.

The analog-digital converter 26 carries out multiplexing with the following truth table:

| E+ | E− | E1 | E2 |
|---|---|---|---|
| B | B | 0 | 0 |
| B | A | 0 | 1 |
| A | B | 1 | 0 |
| A | A | 1 | 1 |

With A<Vdd-Vtp and B>Vdd-Vtp, Vdd is the supply voltage and Vtp is the threshold voltage of the transistors of the analog-digital converter 26, for example, of the PMOS type. Thus, with two inputs it is possible to make four combinations.

The following truth table makes it possible to generate the control signals for the breakdown inducing transistors 19 via the generating means 20:

| E+ | E− | E1 | E2 | S1 | S2 | S3 | S4 |
|---|---|---|---|---|---|---|---|
| B | B | 0 | 0 | 0 | 1 | 1 | 1 |
| B | A | 0 | 1 | 1 | 0 | 1 | 1 |
| A | B | 1 | 0 | 1 | 1 | 0 | 1 |
| A | A | 1 | 1 | 1 | 1 | 1 | 0 |

To be able to initiate breakdown in a number of breakdown inducible components greater than four, an analog-digital converter 26 capable of interpreting a higher number of voltage levels is used. The analog-digital converter 26 comprises at least two MOS transistors whose gates are connected to one of the inputs E+, E−. The sources are connected to the Vdd supply voltage and the drains forming the outputs are each connected to a current source.

These MOS transistors have different width-to-length ratios so that they switch for different and staggered gate voltages. In the case of three MOS transistors per input E+ and E−, switch voltages of −1.3 volts, −2.2 volts and −3.5 volts with respect to the supply voltage Vdd may be provided. The dual structure is possible. The switch voltages are, in this case, referenced with respect to ground.

In the case of a circuit to be adjusted which has a single input, the four regions with three structures in parallel makes it possible to initiate breakdown in four breakdown inducible components. One of which will be able to serve for the irreversible inhibition, such as for the component 23 in FIG. 4. In the case of a circuit to be adjusted which has two inputs, the four regions per input make it possible to initiate breakdown in six breakdown inducible components. One of which will be able to serve for the irreversible inhibition. In general, the number of components able to be initiated is equal to the number of inputs multiplied by the number of switching (MOS transistors) structures in parallel on each input increased by the number 1.

Figure 5:
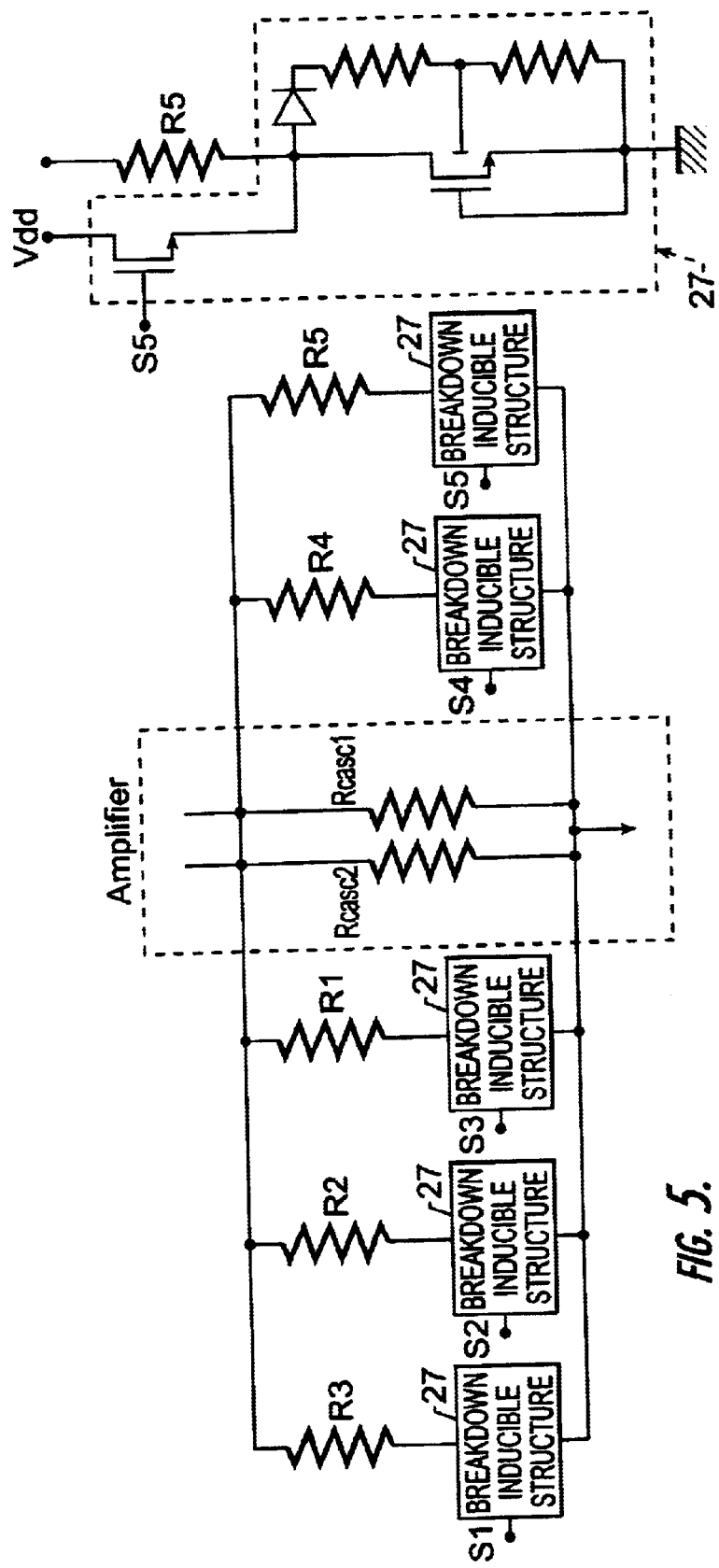
FIG. 5 is a diagram showing an example of how the components according to the present invention are used.

FIG. 5 illustrates an example of an integrated circuit for adjusting the offset voltage of an operational amplifier comprising a cascode circuit as an input. Only the resistors $R_{casc1}$ and $R_{casc2}$ of the cascode circuit are illustrated. These resistors respectively correspond to the inverting and non-inverting inputs of the amplifier. Two parallel branches are connected in parallel with the resistor $R_{casc1}$, and three parallel branches are connected in parallel with the resistor $R_{casc2}$.

The five branches are of similar construction. One branch comprises, in series, a resistor, $R_1$, $R_2$, $R_3$, $R_4$ or $R_5$, and a breakdown inducible structure 27 comprising a breakdown inducible component and its associated initiating switch. Each resistor $R_1$, $R_2$, $R_3$, $R_4$, $R_5$ is in series with a breakdown inducible component but not with the corresponding initiating switch. By selectively choosing the values of the resistors $R_1$, $R_2$, $R_3$, $R_4$, $R_5$ it is possible to obtain a wide range of resistance values after breakdown, $R_{bd1}$ and $R_{bd2}$, on each input of the amplifier. It is also possible to correct adjustment defects in the offset voltage in a precise manner and over a wide range. Thus:

$$R_{bd1}=1/(1/R_{casc1}+1/(R_1 \text{ or } 4)+1/(R_2 \text{ or } 4)+1/(R_3 \text{ or } 4)),$$

$$R_{bd2}=1/(1/R_{casc2}+1/(R_4 \text{ or } 4)+1/(R_5 \text{ or } 4)).$$

Each branch thus has an infinite resistance, denoted by 4, if its structure 27 has not undergone breakdown. Each branch has a resistance equal to the sum of the resistance of the structure 27 that has undergone breakdown, e.g., 11 ohms, and of the resistance of the resistor $R_1$, $R_2$, $R_3$, $R_4$, $R_5$. The resistance is approximately equal to the resistance of the resistor $R_1$, $R_2$, $R_3$, $R_4$, $R_5$ which is of a markedly higher value, i.e., on the order of a few kilohms or a few tens of kilohms.

The invention provides the benefit of an induction device for components which are able to breakdown. The device is inexpensive, small in size, consumes little power and is very reliable. The breakdown is established after the circuit has been encapsulated, and is induced via the conventional pins, such as the ground/supply pins, and the input/output pins. The breakdown requires no additional pins.

Figure 6:
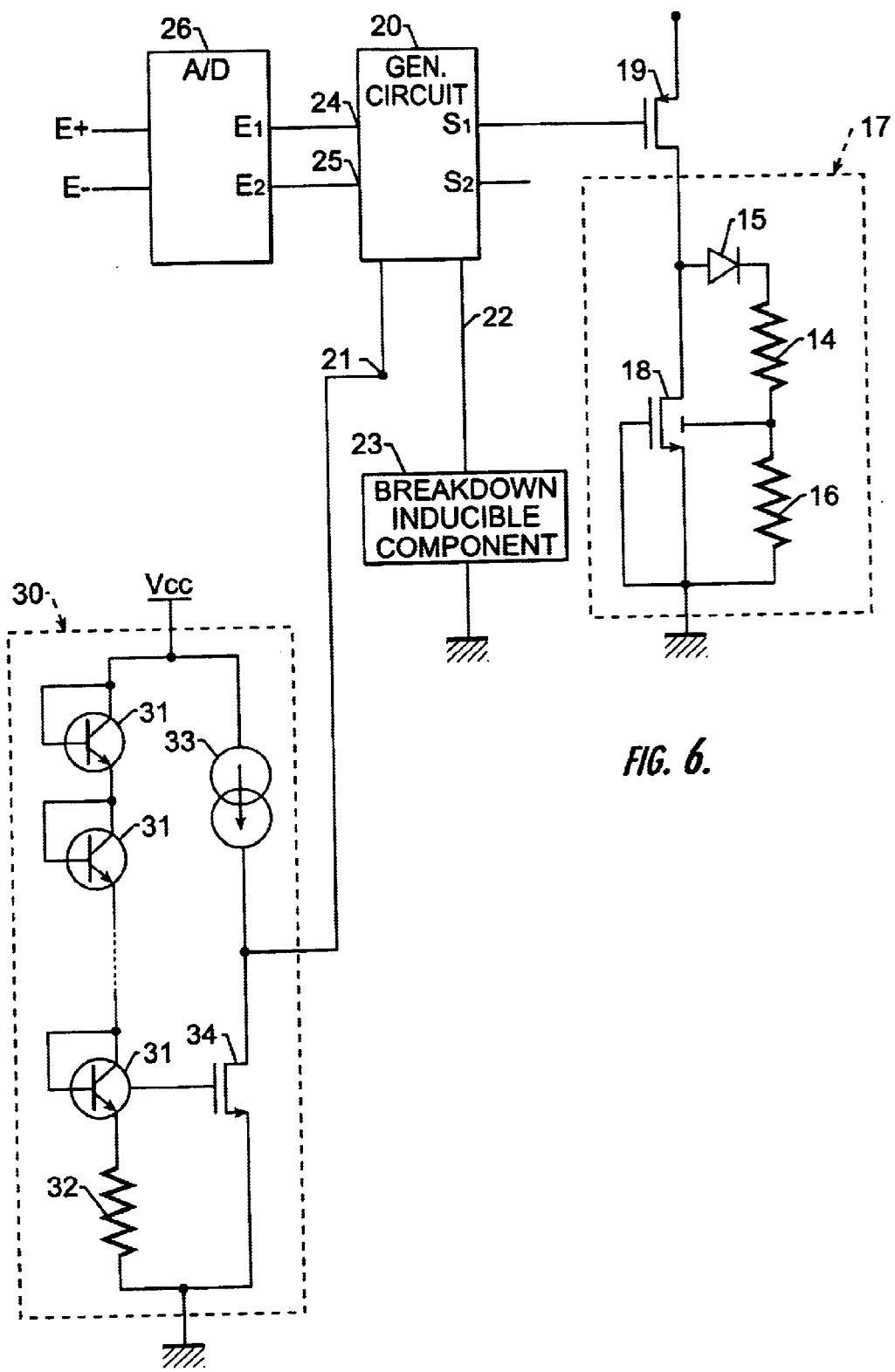
FIG. 6 is a diagram of another embodiment of the component provided with a breakdown inducible component illustrated in FIG. 4.

In the variation illustrated in FIG. 6, a module 30 is connected to the generating means 20 to measure the parameter to be adjusted, such as the voltage Vio for an operational amplifier mounted as a comparator. This may be performed in a circuit-adjustment phase during a final sorting operation.

The module 30 comprises a plurality of n diodes 31 connected in series between a supply voltage and a resistor 32 connected to ground. A current source 33 is connected in series with an NMOS transistor 34 between a supply voltage and ground. The gate of the transistor 34 is connected to the common point between the resistor 32 and the series of n diodes 31.

For a standard supply voltage, such as 5 volts, for example, the transistor 34 is off. Hence, a logic 1 level is applied to terminal 21, thereby inhibiting any selection of a component 17. A higher voltage, which depends on the number n of diodes 31, turns the transistor 34 on. Hence, a logic 0 level on terminal 21 and the possibility of selecting a component 17, the selection of which may result in voltage oscillations in the generating means 20, are necessary for an accurate voltage measurement.

The module 30 makes it possible to inhibit the generating means 20, and therefore, turn off the transistor 19 for controlling the breakdown inducible component 17. The generating means 20 is inhibited for a voltage which is always less than or equal to the nominal supply voltage of the circuit. Above the voltage fixed by the module 30, the transistor is turned on, and consequently, so is the breakdown inducible component 17 just before reaching the breakdown voltage.

The module 30 therefore makes it possible, first, to measure the parameter to be adjusted for supply voltages less than the switching voltage of the module 30, and second, to adjust the parameter for the supply voltage greater than the voltage of the module 30. In the industrial phase, it is difficult without the module 30 to measure the parameter accurately since, with the adjustment device being active, the measurement is falsified by the selection of a structure.

At the end of the final sorting, with the adjustment having been made, the irreversible inhibition process is carried out by the breakdown inducible component 23 which turns off, once and for all, the adjustment structures. Thus, it is possible to measure the parameter to be adjusted before the irreversible inhibition. The module 30 makes it possible to turn off the components 17.

Figure 7:
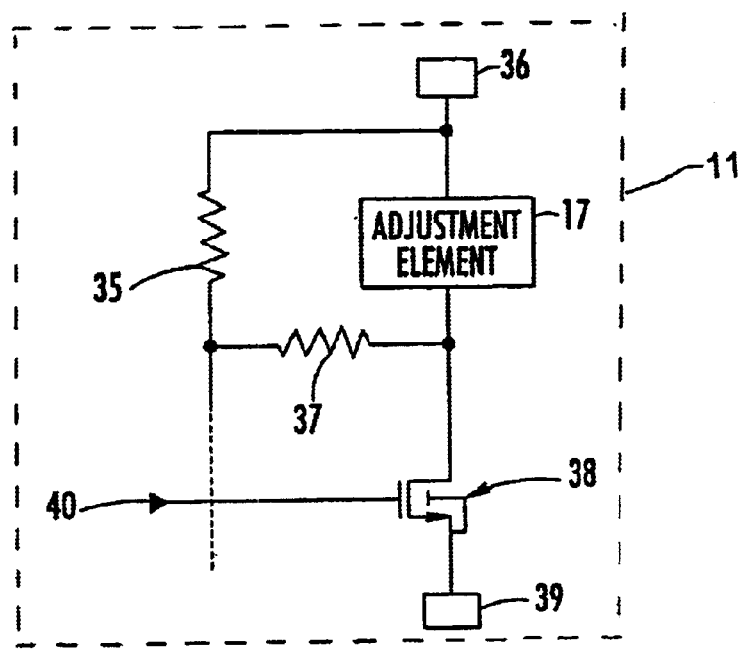
FIG. 7 is a diagram of a circuit according to one aspect of the present invention.

In the embodiment illustrated in FIG. 7, a circuit comprises an adjustment component 17, a resistor 35 to be adjusted, a supply contact 36 accessible during adjustment, a resistor 37, an NMOS type control transistor 38, a ground contact 39 accessible during adjustment and a control input 40 connected to the gate of the control transistor 38. The resistor 35 to be adjusted has one terminal connected to the supply contact 36, and another terminal connected to the resistor 37 and to the rest of the circuit (not shown), with which the resistor to be adjusted will interact during normal operation of the circuit after adjustment and packaging.

The component 17 is mounted between the supply contact 36 and the drain of the control transistor 38. The resistor 37 is mounted between the resistor 35 to be adjusted and the drain of the control transistor 38. In other words, the resistor 35 to be adjusted and the resistor 37 are mounted in parallel with component 17. The source of the control transistor 38 is connected to the ground contact 39. The component 17 as illustrated in FIGS. 4 and 6 includes the source and the gate of its MOS transistor 18 connected to the drain of the control transistor 38 and its drain connected to the supply contact 36. The circuit is well suited to the adjustment of one or more resistors which do not have any direct connection to the ground contact 39 and are connected to the supply contact 36.

Figure 8:
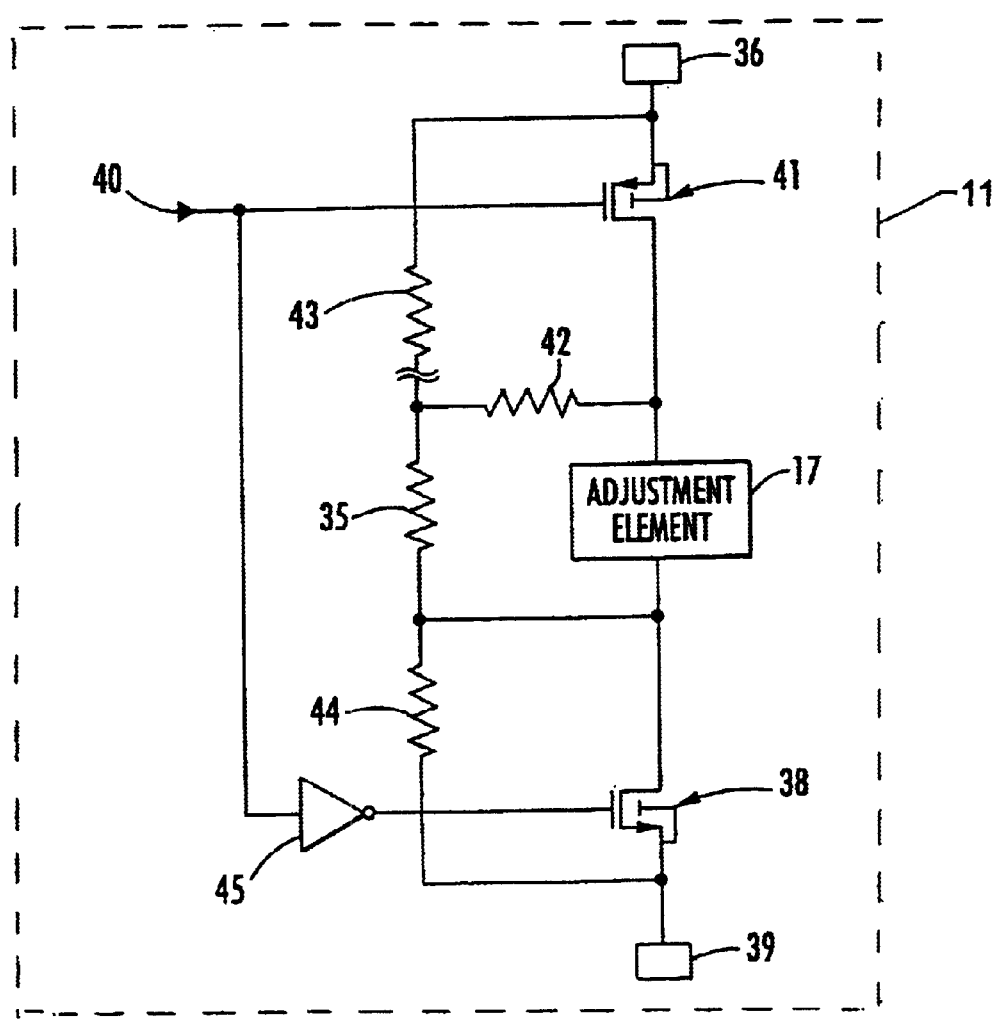
FIG. 8 is a diagram of a circuit according to another aspect of the present invention.

The embodiment illustrated in FIG. 8 is similar to the previous one except for another PMOS type control transistor 41 which is placed between the supply contact 36 and the component 17, with its source connected to the supply contact 36 and its drain connected to the component 17. A resistor 42 is placed between a first terminal of the resistor 35 to be adjusted and the drain of the control transistor 41. The second terminal of the resistor 35 to be adjusted is connected to the drain of the control transistor 38.

A resistor 43 is placed between the first terminal of the resistor 35 to be adjusted and the supply contact 36. A resistor 44 is placed between the second terminal of the resistor 35 to be adjusted and the ground contact 39. The gate of the control transistor 41 is connected to the control input 40. An inverter 45 is mounted between the control input 40 and the gate of the control transistor 38.

The circuit is well suited to the adjustment of one or more resistors having no direct connection either to the ground contact 39 or to the supply contact 36. The circuit may also serve for adjusting one or more resistors provided with direct connections to the ground contact 39 and/or to the supply contact 36.

By appropriately dimensioning the control transistors it is possible to optimize the semiconductor wafer area used. Since the mobility of electrons is greater than that of holes, a control transistor 41 may be chosen having a resistance $R_{on}$ three times greater than that of the control transistor 38, such as 30 Ω and 10 Ω, for example. Moreover, it is preferable to use an isolated-type MOS transistor for the component 17 to prevent the currents from being modified by the substrate resistance of a structure which is not isolated.

Figure 9:
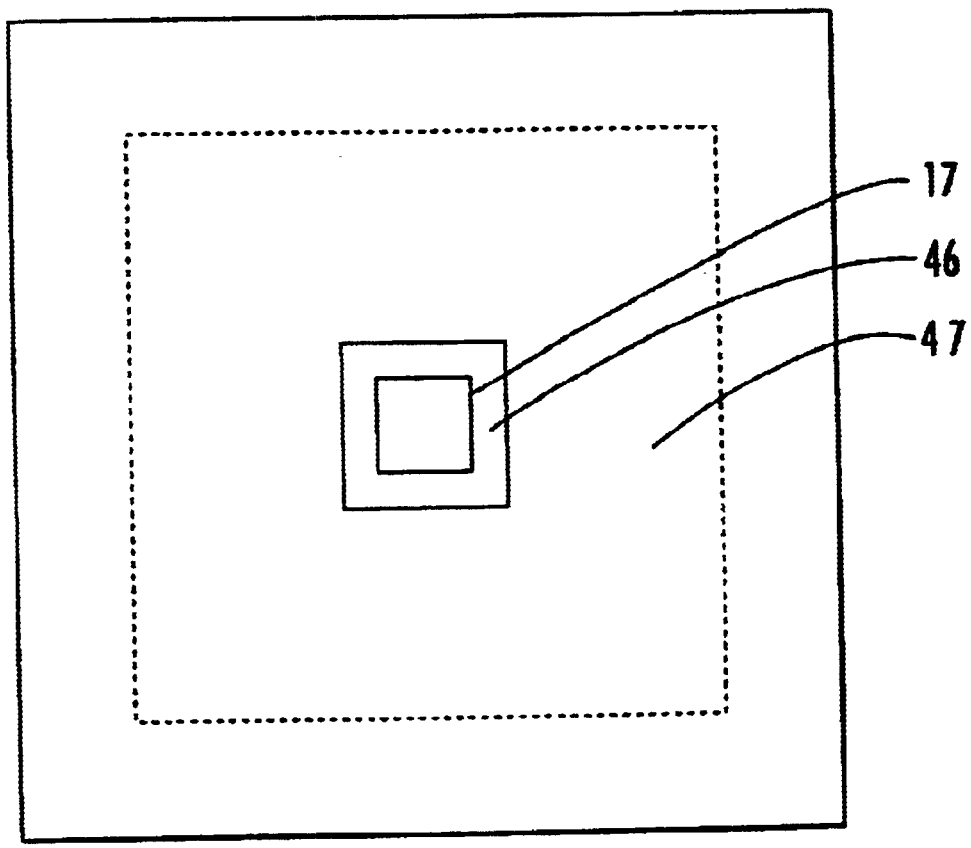
FIG. 9 is a top view of a MOS transistor used in the component illustrated in FIG. 8.

As illustrated in FIG. 9, the MOS transistor of the component 17 is surrounded by a ring 46 of p+-type conductivity. Contact with this p+-type conductivity ring 46 takes place on the drain side to facilitate breakdown of the MOS transistor 17, and the spatial dimensions of the substrate 47 are substantially increased, such as by 20 μm, for example. Thus, the current gain of the parasitic bipolar transistor associated with the MOS transistor 17, the base of which is connected to the well, the collector of which is connected to the connection contacts of a buried layer ($n_{iso}$) and the emitter of which is connected to the source of the MOS transistor is decreased. The drawbacks of using an isolated structure are thus avoided.

That which is claimed is:

1. An integrated circuit comprising:
   a substrate;
   an adjustment resistor on said substrate;
   at least one control transistor on said substrate and connected to a first voltage reference; and
   an adjustment element on said substrate and connected in parallel with said adjustment resistor for adjusting a combined electrical resistance of said adjustment element and said adjustment resistor, said adjustment element connected to said at least one control transistor and comprising
   a MOS transistor comprising a source, a drain, and a gate on said substrate, said MOS transistor defining a parasitic bipolar transistor with said substrate,
   a first resistor connected between said substrate and the source,
   a second resistor connected between said substrate and the drain,
   a diode connected in series with said second resistor between said substrate and the drain, and
   the gate and the source of said MOS transistor being connected together, and application of a voltage between the drain and the source biases a base/emitter junction of the parasitic bipolar transistor for breaking down said MOS transistor so that said adjustable element forms an electrical resistance having a value determined by a current generated by the applied voltage.

2. An integrated circuit according to claim 1, wherein an avalanche of a drain/substrate junction, an irreversible breakdown of a drain/substrate junction, and a short circuit between the drain and the source causes the breakdown of said MOS transistor.

3. An integrated circuit according to claim 1, further comprising a resistor connected in series with said adjustment resistor, and having a common terminal with said adjustment element.

4. An integrated circuit according to claim 1, wherein said adjustment resistor has a first terminal connected at a floating potential and a second terminal connected to a second voltage reference.

5. An integrated circuit according to claim 1, wherein said at least one control transistor comprises an NMOS transistor.

6. An integrated circuit according to claim 1, wherein said at least one control transistor comprises:

a first control transistor connected between a second voltage reference and said adjustment element; and a second control transistor connected between said adjustment element and the first voltage reference.

7. An integrated circuit according to claim 6, wherein said adjustment resistor has first and second terminals at a floating potential.

8. An integrated circuit according to claim 6, wherein said adjustment resistor has a first terminal at a floating potential, and a second terminal connected to at least one of the first and second voltage references.

9. An integrated circuit according to claim 6, wherein said first control transistor comprises a PMOS transistor, and said second control transistor comprises an NMOS transistor.

10. An integrated circuit according to claim 1, wherein said MOS transistor comprises an NMOS transistor.

11. An integrated circuit according to claim 1, wherein said MOS transistor forms an isolated structure.

12. An integrated circuit according to claim 1, wherein said substrate comprises a ring of p+-type conductivity surrounding said MOS transistor.

13. An integrated circuit according to claim 12, wherein said substrate comprises a well surrounding said ring, and a distance between an outer edge of said ring and an outer edge of said well is greater than or equal to 20 $\mu$m.

14. An integrated circuit comprising:

a substrate;

an adjustment resistor on said substrate;

at least one control transistor on said substrate and connected to a first voltage reference; and an adjustment element on said substrate and connected in parallel with said adjustment resistor for adjusting a combined electrical resistance of said adjustment element and said resistor, said adjustment element connected to said at least one control transistor and comprising a MOS transistor comprising a source, a drain, and a gate, said MOS transistor defining a parasitic bipolar transistor with said substrate, a first resistor connected between said substrate and the source, a second resistor connected between said substrate and the drain, a diode connected in series with said second resistor between said substrate and the drain, and the gate and the source being connected together with said MOS transistor being broken down so that said adjustable element forms an electrical resistance.

15. An integrated circuit according to claim 14, wherein a value of the electrical resistance is determined by a current generated by a voltage applied between the drain and the source of said MOS transistor.

16. An integrated circuit according to claim 14, wherein the base/emitter junction of the parasitic bipolar transistor is biased based upon an applied voltage between the drain and the source of said MOS transistor.

17. An integrated circuit according to claim 14, wherein an avalanche of a drain/substrate junction, an irreversible breakdown of a drain/substrate junction, and a short circuit between the drain and the source causes the breakdown of said MOS transistor.

18. An integrated circuit according to claim 14, further comprising a resistor connected in series with said adjustment resistor, and having a common terminal with said adjustment element.

19. An integrated circuit according to claim 14, wherein said adjustment resistor has a first terminal connected at a floating potential and a second terminal connected to a second voltage reference.

20. An integrated circuit according to claim 14, wherein said at least one control transistor comprises an NMOS transistor.

21. An integrated circuit according to claim 14, wherein said at least one control transistor comprises:

a first control transistor connected between a second voltage reference and said adjustment element; and a second control transistor connected between said adjustment element and the first voltage reference.

22. An integrated circuit according to claim 21, wherein said adjustment resistor has first and second terminals at a floating potential.

23. An integrated circuit according to claim 21, wherein said adjustment resistor has a first terminal at a floating potential, and a second terminal connected to at least one of the first and second voltage references.

24. An integrated circuit according to claim 21 wherein said first control transistor comprises a PMOS transistor, and said second control transistor comprises an NMOS transistor.

25. An integrated circuit according to claim 14 wherein said MOS transistor comprises an NMOS transistor.

26. An integrated circuit according to claim 14 wherein said MOS transistor forms an isolated structure.

27. An integrated circuit according to claim 14 wherein said substrate comprises a ring of p+-type conductivity surrounding said MOS transistor.

28. An integrated circuit according to claim 27 wherein said substrate comprises a well surrounding said ring, and a distance between an outer edge of said ring and an outer edge of said well is greater than or equal to 20 $\mu$m.

* * * * *